United States Patent
Enomoto et al.

(10) Patent No.: US 9,751,984 B2
(45) Date of Patent: Sep. 5, 2017

(54) POLYIMIDE PRECURSOR, PHOTOSENSITIVE RESIN COMPOSITION CONTAINING SAID POLYIMIDE PRECURSOR, AND CURED-PATTERN-FILM MANUFACTURING METHOD AND SEMICONDUCTOR DEVICE USING SAID PHOTOSENSITIVE RESIN COMPOSITION

(71) Applicant: Hitachi Chemical DuPont MicroSystems, Ltd., Tokyo (JP)

(72) Inventors: Tetsuya Enomoto, Ibaraki (JP); Keishi Ono, Ibaraki (JP); Masayuki Ohe, Ibaraki (JP); Keiko Suzuki, Ibaraki (JP); Kazuya Soejima, Ibaraki (JP); Etsuharu Suzuki, Ibaraki (JP)

(73) Assignee: HITACHI CHEMICAL DUPONT MICROSYSTEMS, LTD., Tokyo (JP)

( * ) Notice: Subject to any disclaimer, the term of this patent is extended or adjusted under 35 U.S.C. 154(b) by 0 days.

(21) Appl. No.: 14/654,758

(22) PCT Filed: Dec. 19, 2013

(86) PCT No.: PCT/JP2013/007467
§ 371 (c)(1),
(2) Date: Jun. 22, 2015

(87) PCT Pub. No.: WO2014/097633
PCT Pub. Date: Jun. 26, 2014

(65) Prior Publication Data
US 2015/0353685 A1    Dec. 10, 2015

(30) Foreign Application Priority Data
Dec. 21, 2012   (JP) .................. 2012-279343

(51) Int. Cl.
  G03F 7/038   (2006.01)
  G03F 7/037   (2006.01)
  (Continued)

(52) U.S. Cl.
  CPC ........ C08G 73/1007 (2013.01); C08F 290/14 (2013.01); C08G 73/1039 (2013.01);
  (Continued)

(58) Field of Classification Search
  CPC .......... G03F 7/0387; G03F 7/20; G03F 7/168; G03F 7/32; G03F 7/40; G03F 7/031;
  (Continued)

(56) References Cited

U.S. PATENT DOCUMENTS 4,811,082 A * 3/1989 Jacobs .................. H01L 23/538
                                                           174/261
5,019,482 A * 5/1991 Ai ......................... G03F 7/032
                                                           430/281.1

(Continued)

FOREIGN PATENT DOCUMENTS

CN    101646741 A    2/2010
CN    101866707 A    10/2010
(Continued)

OTHER PUBLICATIONS

Coburn et al "Relaxation Behavior of Polyimides based on 2,2'-Disubstituted Benzidines", Macromolecules, 1995, vol. 28, pp. 3253-3260.*

(Continued)

*Primary Examiner* — Cynthia Hamilton
(74) *Attorney, Agent, or Firm* — Griffin and Szipl PC

(57) ABSTRACT

A polyimide precursor including a structural unit represented by the following general formula (1) in a ratio of 50 mol % or more based on the total structural units. In the general formula (1), A is a tetravalent organic group represented by the following general formula (2a), a tetravalent organic group represented by the following general formula (2b), or a tetravalent organic group represented by the following general formula (2c), and B is a divalent organic group represented by the following general formula (3).

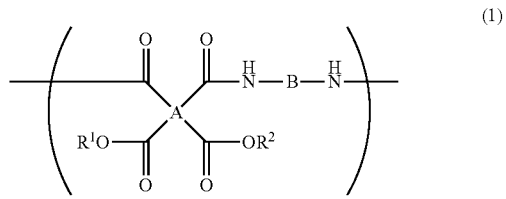

(1)

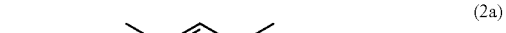

(2a)

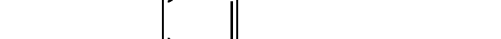

(2b)

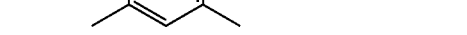

(2c)

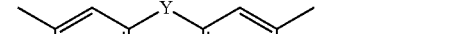

(3)

13 Claims, 1 Drawing Sheet

(51) Int. Cl.

| | |
|---|---|
| G03F 7/031 | (2006.01) |
| C08G 73/10 | (2006.01) |
| C08G 73/16 | (2006.01) |
| C08K 5/33 | (2006.01) |
| G03F 7/16 | (2006.01) |
| G03F 7/20 | (2006.01) |
| G03F 7/32 | (2006.01) |
| G03F 7/40 | (2006.01) |
| C08F 290/14 | (2006.01) |
| H01L 21/02 | (2006.01) |
| H01L 21/311 | (2006.01) |
| C09D 179/08 | (2006.01) |

(52) U.S. Cl.
CPC ..... *C08G 73/1042* (2013.01); *C08G 73/1053* (2013.01); *C08G 73/1067* (2013.01); *C08G 73/1071* (2013.01); *C08G 73/16* (2013.01); *C08K 5/33* (2013.01); *C09D 179/08* (2013.01); *G03F 7/031* (2013.01); *G03F 7/037* (2013.01); *G03F 7/0387* (2013.01); *G03F 7/0388* (2013.01); *G03F 7/168* (2013.01); *G03F 7/20* (2013.01); *G03F 7/32* (2013.01); *G03F 7/40* (2013.01); *H01L 21/02118* (2013.01); *H01L 21/311* (2013.01)

(58) Field of Classification Search
CPC .. G03F 7/027; H01L 21/311; H01L 21/02118; C09D 179/08; C08K 5/3475; C08K 5/3472
See application file for complete search history.

(56) References Cited

U.S. PATENT DOCUMENTS

| | | | | |
|---|---|---|---|---|
| 5,260,408 | A * | 11/1993 | Auman | C07D 311/82 428/473.5 |
| 5,310,625 | A * | 5/1994 | Angelopoulos | C08F 283/04 430/283.1 |
| 6,162,580 | A | 12/2000 | Matsuoka et al. | |
| 6,482,569 | B1 | 11/2002 | Matsuoka et al. | |
| 6,610,815 | B1 | 8/2003 | Hata et al. | |
| 8,173,349 | B2 | 5/2012 | Hikita et al. | |
| 2002/0032273 | A1* | 3/2002 | Tanaka | C08G 73/1025 524/548 |
| 2007/0154843 | A1 | 7/2007 | Kanada et al. | |
| 2009/0202794 | A1 | 8/2009 | Shibui | |
| 2009/0233228 | A1 | 9/2009 | Shibui | |
| 2010/0143673 | A1 | 6/2010 | Mitsukura et al. | |
| 2010/0244655 | A1 | 9/2010 | Kim et al. | |
| 2010/0260983 | A1 | 10/2010 | Minegishi et al. | |
| 2011/0242468 | A1* | 10/2011 | Choi | C08G 8/12 349/129 |
| 2012/0248634 | A1* | 10/2012 | Mitsukura | H01L 21/6836 257/798 |
| 2012/0251949 | A1 | 10/2012 | Miyabe et al. | |
| 2014/0343199 | A1 | 11/2014 | Malik et al. | |

FOREIGN PATENT DOCUMENTS

| | | | |
|---|---|---|---|
| JP | 5-295115 | A | 11/1993 |
| JP | 7-242744 | A | 9/1995 |
| JP | 7-304950 | A | 11/1995 |
| JP | 08-231718 | A | 9/1996 |
| JP | 2826940 | B2 | 9/1998 |
| JP | 11-35684 | A * | 2/1999 |
| JP | 11-338157 | A | 12/1999 |
| JP | 2001-254014 | A | 9/2001 |
| JP | 2002-131905 | A | 5/2002 |
| JP | 2002-265631 | A | 9/2002 |
| JP | 3526829 | B2 | 2/2004 |
| JP | 2004-182962 | A | 7/2004 |
| JP | 4144110 | B2 | 6/2008 |
| JP | 4524808 | B2 | 6/2010 |
| JP | 2010-236000 | A | 10/2010 |
| JP | 2011-164454 | A | 8/2011 |

OTHER PUBLICATIONS

Sasaki et al, Accession No. 1999:101110, from Scifinder database, English abstract and compounds listed in Registry therefore of JP 11-035684 Patent information dated Feb. 9, 1999, 14 pages.*

English translation of JP, 11-035684, A (1999) from machine translation from AIPN Japan Patent Office National Center for Industrial Property Information and Training, generated Sep. 29, 2015, 9 pages.*

Hasegawa et al, "Low-CTE Polyimides Derived from 2,3,6,7-Naphthalenetetracarboxylic Dianhydride", Polymer Journal, vol. 39, No. 6, pp. 610-621, Year 2007.*

Pyo et al "Synthesis and CHaracterization of Fully Rodlike Poly(4,4'-biphenylne pyromellitimide)s with Various Short Side Groups", Journal of Polymer Science: Part A: Polymer Chemistry, vol. 37, John Wiley & Sons, Inc , 1999, pp. 937-957.*

Dine-Hart et al "Effect of Structural Variations on the Thermo-oxidative Stability of Aromatic Polyimides", De Makromolekulare Chemi, vol. 153 (1972) pp. 237-254.*

International Search Report issued in application PCT/JP2013/007345, completed Mar. 3, 2014 and mailed Mar. 11, 2014.

English translation of the International Preliminary Report on Patentability in application PCT/JP2013/007345, issued Jun. 23, 2015.

International Search Report issued in application PCT/JP2013/007467, completed Mar. 10, 2014 and mailed Mar. 18, 2014.

English translation of the International Preliminary Report on Patentability in application PCT/JP2013/0073467 issued Jun. 23, 2015.

Office action issued in related Chinese application 201380067191.7 on Jul. 5, 2016 (no translation available; submitted for certification).

Non-Final Office Action issued in co-pending related U.S. Appl. No. 14/654,740 on Mar. 2, 2016.

Office Action issued in corresponding Chinese patent application 201380066870.2 on Apr. 20, 2016 (no translation available, submitted for certification).

Office Action issued in co-pending related U.S. Appl. No. 14/654,740 on Dec. 14, 2016.

Office Action issued in corresponding Taiwanese patent application 102147064, dated Apr. 7, 2017 (no translation available; submitted for certification).

* cited by examiner

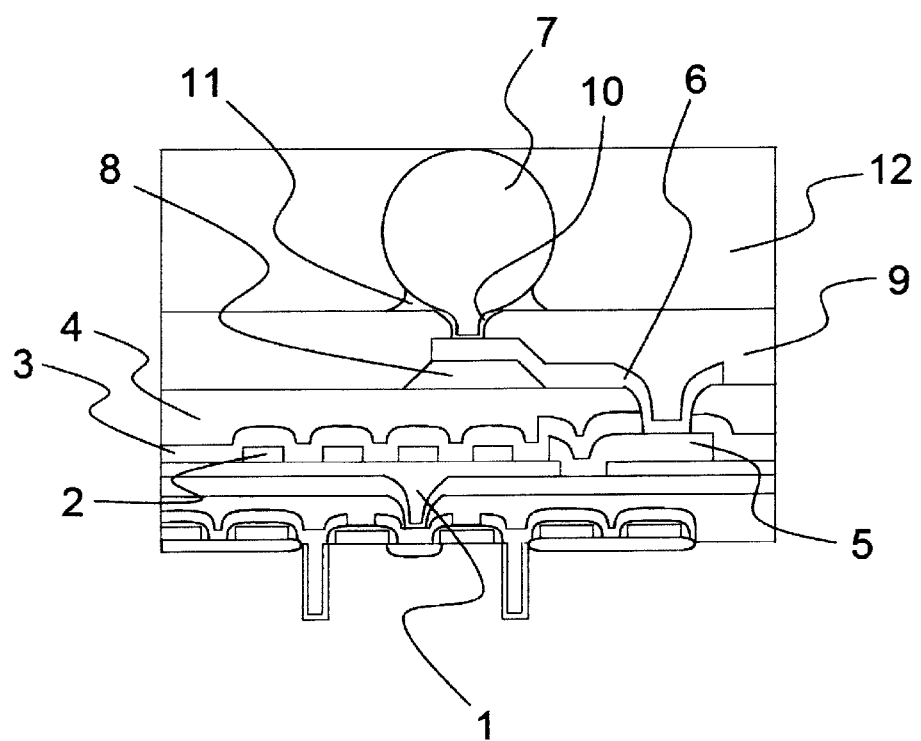

POLYIMIDE PRECURSOR, PHOTOSENSITIVE RESIN COMPOSITION CONTAINING SAID POLYIMIDE PRECURSOR, AND CURED-PATTERN-FILM MANUFACTURING METHOD AND SEMICONDUCTOR DEVICE USING SAID PHOTOSENSITIVE RESIN COMPOSITION

This is a National Phase Application in the United States of International Patent Application No. PCT/JP2013/007467 filed Dec. 19, 2013, which claims priority on Japanese Patent Application No. 2012-279343, filed Dec. 21, 2012. The entire disclosures of the above patent applications are hereby incorporated by reference.

TECHNICAL FIELD

The invention relates to a polyimide precursor, a photosensitive resin composition that includes the polyimide precursor, a method for producing a patterned cured film that utilizes the photosensitive resin composition, and a semiconductor device.

BACKGROUND ART

In recent years, an organic material that exhibits high heat resistance (e.g., polyimide resin) has been widely applied as a protective film material for a semiconductor integrated circuit (LSI) (see Patent Documents 1 and 2, for example).

A protective film (cured film) that utilizes a polyimide resin is obtained by applying a polyimide precursor or a resin composition that includes a polyimide precursor to a substrate, followed by drying to form a resin film, and curing the resin film by heating.

It is has been desired to reduce the dielectric constant of an interlayer insulating film (low-k layer) along with miniaturization of a semiconductor integrated circuit. The dielectric constant may be reduced by utilizing an interlayer insulating film having a porous structure. However, this method has a problem in that a decrease in mechanical strength occurs. A protective film may be provided on an interlayer insulating film that exhibits low mechanical strength in order to protect the interlayer insulating film.

An increase in thickness (e.g., 5 μm or more) and an increase in modulus of elasticity (e.g., 4 GPa or more) have been desired for such a protective film in order to prevent a situation in which stress is concentrated on the interlayer insulating film in an area in which a bump (protruding external electrode) is formed, and the interlayer insulating film breaks. However, when the thickness and the modulus of elasticity of the protective film are increased, the stress of the protective film may increase, and the semiconductor wafer may be warped to a large extent, whereby a problem may occur when transferring or securing the wafer. Therefore, development of a polyimide resin that exhibits low stress has been desired.

The stress of the polyimide resin may be reduced by causing the molecular chain of the polyimide to have a rigid skeleton in order to bring the coefficient of thermal expansion of the polyimide closer to the coefficient of thermal expansion of a silicon wafer (see Patent Document 3, for example), or introducing a flexible structure such as a siloxane structure into the polyimide to reduce the modulus of elasticity of the polyimide (see Patent Document 4, for example), for example.

When the polyimide resin that is used to form the protective film exhibits photosensitivity, it is possible to easily form a patterned resin film. A patterned cured film can be easily formed by curing such a patterned resin film by heating.

A polyimide resin that exhibits photosensitivity may be obtained by providing the polyimide with photosensitivity. It is possible to provide the polyimide with photosensitivity by introducing a methacryloyl group into the polyimide precursor through an ester bond or an ionic bond, utilizing a soluble polyimide that includes a photopolymerizable olefin, or utilizing a self-sensitizing polyimide that has a benzophenone skeleton, and includes an alkyl group at the ortho-position of the aromatic ring to which a nitrogen atom is bonded (see Patent Document 5, for example), for example. The method that introduces a methacryloyl group into the polyimide precursor through an ester bond has advantages in that it is possible to arbitrarily select a monomer when synthesizing the polyimide precursor, and excellent temporal stability is achieved since a methacryloyl group is introduced through a chemical bond.

However, when a large amount of aromatic ring units are introduced in the polyimide resin that exhibits low stress in order to cause the molecular chain to have a rigid skeleton, a large amount of conjugate aromatic ring units are included in the molecular chain, and even an polyamic acid (polyimide precursor) (i.e., a precursor of polyimide resin) has absorption in the ultraviolet region. Therefore, the transmittance of an i-line (wavelength: 365 nm) that is widely used for an exposure step for forming a patterned resin film may decrease, and the sensitivity and the resolution tend to decrease. When the thickness of the protective film is increased, the i-line transmittance may further decrease, and it may be difficult to form a patterned resin film. A decrease in heat resistance may occur when a flexible structure such as a siloxane structure is introduced.

RELATED-ART DOCUMENT

Patent Document

Patent Document 1: Japanese Patent No. 3526829
Patent Document 2 Japanese Patent No. 4524808
Patent Document 3: JP-A-H05-295115
Patent Document 4: JP-A-H07-304950
Patent Document 5: JP-A-H07-242744

SUMMARY OF THE INVENTION

An object of the invention is to provide a polyimide precursor that produces a patterned cured film that exhibits excellent i-line transmittance and low stress, and a photosensitive resin composition that includes the polyimide precursor.

Another object of the invention is to provide a method for producing (forming) a patterned cured film that exhibits excellent i-line transmittance and low stress.

Several aspects of the invention provide the following polyimide precursor and the like.

1. A polyimide precursor including a structural unit represented by the following general formula (1) in a ratio of 50 mol % or more based on the total structural units,

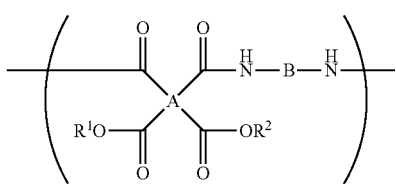
(1)

wherein A is the tetravalent organic group represented by the following formula (2a), the tetravalent organic group represented by the following formula (2b), or a tetravalent organic group represented by the following general formula (2c),
B is a divalent organic group represented by the following general formula (3), and $R^1$ and $R^2$ are independently a hydrogen atom or a monovalent organic group,

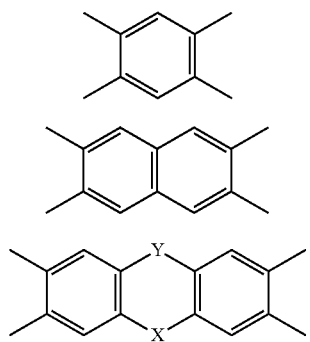
(2a)
(2b)
(2c)

wherein X and Y are independently a divalent group that is not conjugated with the benzene rings bonded thereto, or a single bond,

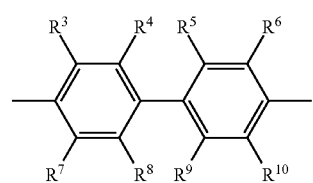
(3)

wherein $R^3$ to $R^{10}$ are independently a hydrogen atom or a monovalent group, at least one of $R^3$ to $R^{10}$ being a fluorine atom or a trifluoromethyl group.

2. The polyimide precursor according to 1, further including a structural unit represented by the following general formula (4),

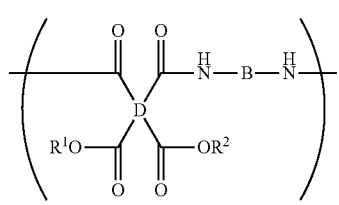
(4)

wherein D is a tetravalent organic group represented by the following general formula (5), and B, $R^1$ and $R^2$ are the same as defined above in connection with the general formula (1),

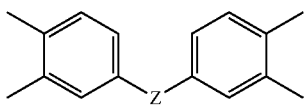
(5)

wherein Z is an ether bond (—O—) or a sulfide bond (—S—).

3. The polyimide precursor according to 2, wherein the polyimide precursor comprises the structural unit represented by the general formula (1) and the structural unit represented by the general formula (4), and the molar ratio of the structural unit represented by the general formula (1) and the structural unit represented by the general formula (4) is 5/5 to 9/1.

4. The polyimide precursor according to any one of 1 to 3, wherein $R^1$ or $R^2$ in the general formula (1) is a monovalent organic group that includes a carbon-carbon unsaturated double bond.

5. A photosensitive resin composition including (a) the polyimide precursor according to any one of 1 to 4, (b) a compound that generates radicals when irradiated with active rays, and (c) a solvent.

6. The photosensitive resin composition according to 5, further including tetrazole, a tetrazole derivative, benzotriazole, or a benzotriazole derivative.

7. The photosensitive resin composition according to 5 or 6, wherein the component (b) includes an oxime ester compound.

8. The photosensitive resin composition according to 7, wherein the oxime ester compound is a compound represented by the following general formula (22), a compound represented by the following general formula (23), or a compound represented by the following general formula (24),

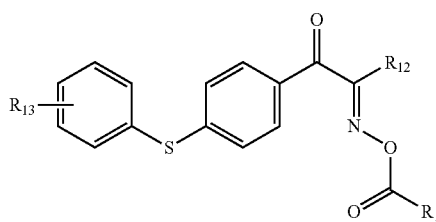
(22)

wherein $R_{11}$ and $R_{12}$ are independently an alkyl group having 1 to 12 carbon atoms, a cycloalkyl group having 4 to 10 carbon atoms, or a phenyl group, and $R_{13}$ is —H, —OH, —COON, —O(CH$_2$)OH, —O(CH$_2$)$_2$OH, —COO(CH$_2$)OH, or —COO(CH$_2$)$_2$OH,

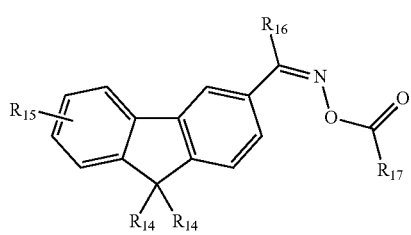
(23)

wherein $R_{14}$ are independently an alkyl group having 1 to 6 carbon atoms, $R_{15}$ is $NO_2$ or ArCO (wherein Ar is an aryl group), and $R_{16}$ and $R_{17}$ are independently an alkyl group having 1 to 12 carbon atoms, a phenyl group, or a tolyl group, (24)

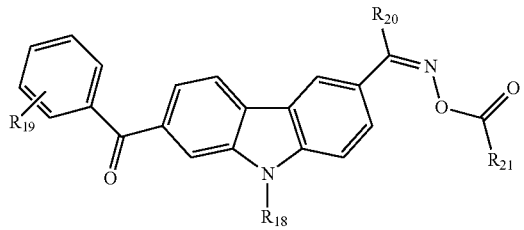

wherein $R_{18}$ is an alkyl group having 1 to 6 carbon atoms, $R_{19}$ is an organic group that includes an acetal bond, and $R_{20}$ and $R_{21}$ are independently an alkyl group having 1 to 12 carbon atoms, a phenyl group, or a tolyl group.

9. A cured film obtained by heating the polyimide precursor according to any one of 1 to 4.

10. A patterned cured film obtained by heating the photosensitive resin composition according to any one of 5 to 8.

11. A method for producing a patterned cured film including:
    applying the photosensitive resin composition according to any one of 5 to 8 to a substrate, and drying the applied photosensitive resin composition to form a film;
    exposing the film in a pattern by applying active rays to the film;
    removing an unexposed area of the film by development to obtain a patterned resin film; and heating the patterned resin film.

12. A semiconductor device including a patterned cured film obtained using the method for producing a patterned cured film according to 11.

The invention thus provides a polyimide precursor that produces a patterned cured film that exhibits excellent i-line transmittance and low stress, and a photosensitive resin composition that includes the polyimide precursor.

The invention thus provides a method for producing (forming) a patterned cured film that exhibits excellent i-line transmittance and low stress.

BRIEF DESCRIPTION OF DRAWINGS

FIG. 1 is a schematic cross-sectional view illustrating a semiconductor device according to one embodiment of the invention that includes a redistribution structure.

DESCRIPTION OF EMBODIMENTS

Polyimide Precursor

The polyimide precursor according to the invention includes a structural unit represented by the following general formula (1) in a ratio of 50 mol % or more based on the total structural units.

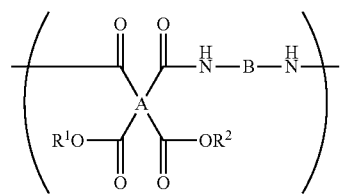

(1)

wherein A is the tetravalent organic group represented by the following formula (2a), the tetravalent organic group represented by the following formula (2b), or a tetravalent organic group represented by the following general formula (2c), B is a divalent organic group represented by the following general formula (3), and $R^1$ and $R^2$ are independently a hydrogen atom or a monovalent organic group,

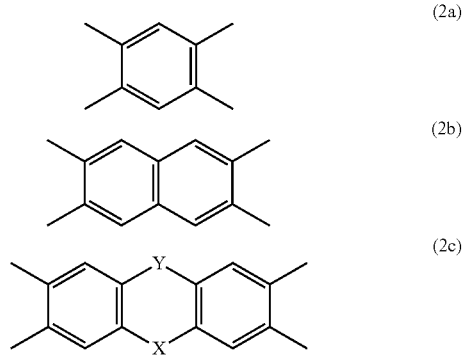

wherein X and Y are independently a divalent group that is not conjugated with the benzene rings bonded thereto, or a single bond,

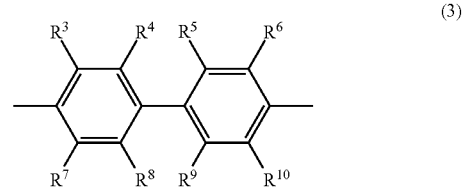

(3)

wherein $R^3$ to $R^{10}$ are independently a hydrogen atom or a monovalent group, at least one of $R^3$ to $R^{10}$ being a fluorine atom or a trifluoromethyl group.

A in the general formula (1) is a structure derived from a tetracarboxylic dianhydride that is used as a raw material for producing the polyimide precursor, and is the tetravalent organic group represented by the formula (2a), the tetravalent organic group represented by the formula (2b), or the tetravalent organic group represented by the general formula (2c).

Examples of the tetracarboxylic dianhydride that produces the structure represented by A include pyromellitic dianhydride, 2,3,6,7-naphthalenetetracarboxylic dianhydride, and the tetracarboxylic dianhydrides respectively represented by the following formulas (6) to (12).

These tetracarboxylic dianhydrides may be used either alone or in combination of two or more when producing (polymerizing) the polyimide precursor.

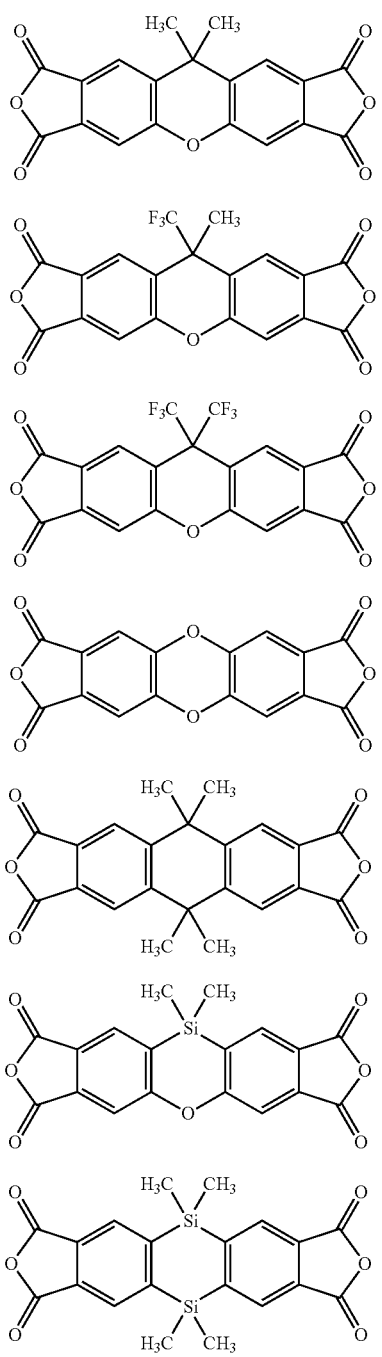

(6)
(7)
(8)
(9)
(10)
(11)
(12)

It is preferable to use pyromellitic dianhydride, the tetracarboxylic dianhydride represented by the formula (6), and the tetracarboxylic dianhydride represented by the formula (8) (either alone or in combination of two or more), and more preferably pyromellitic dianhydride and the tetracarboxylic dianhydride represented by the formula (6) (either alone or in combination of two or more), as the tetracarboxylic dianhydride that produces the structure represented by A, from the viewpoint of reducing thermal expansion.

B in the general formula (1) is a structure derived from a diamine that is used as a raw material for producing the polyimide precursor, and is the divalent organic group represented by the general formula (3).

At least one of $R^3$ to $R^{10}$ in the general formula (3) is a fluorine atom or a trifluoromethyl group. It is preferable that two or more of $R^3$ to $R^{10}$ be a fluorine atom or a trifluoromethyl group. It is more preferable that two or more of $R^3$ to $R^{10}$ be a trifluoromethyl group.

It is possible to reduce water absorption by incorporating a fluorine atom or a trifluoromethyl group (i.e., hydrophobic group) in the polyimide precursor. Therefore, when the polyimide precursor according to the invention is applied to a semiconductor integrated circuit, and cured by heating to form a polyimide protective film, the protective film exhibits reduced water absorption. Such a protective film makes it possible to reduce the evacuation time and suppress contamination of the deposition (evaporation) device when implementing a high vacuum process (e.g., metal thin film deposition) employed in a bump-forming step. This makes it possible to improve productivity.

Examples of the diamine that produces the structure represented by B include the diamines respectively represented by the following formulas (13) to (19).

These diamines may be used either alone or in combination of two or more when producing (polymerizing) the polyimide precursor.

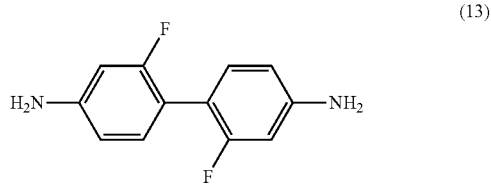

(13)

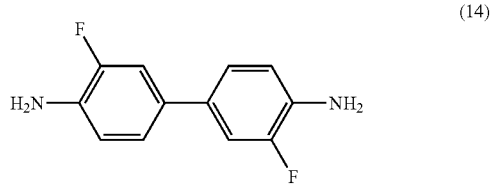

(14)

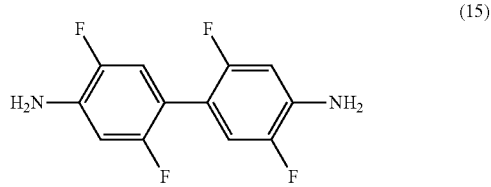

(15)

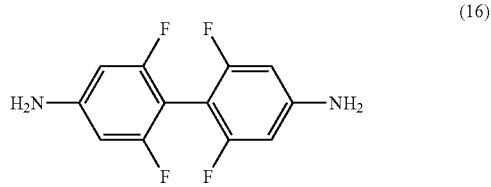

(16)

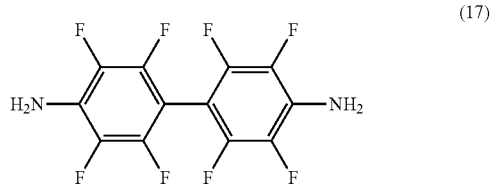

(17)

-continued

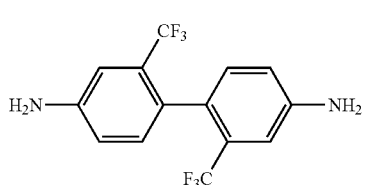

(18)

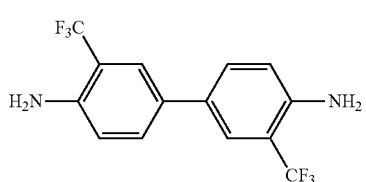

(19)

Among these, the diamines respectively represented by the formulas (13), (18), and (19) are preferable (from the viewpoint of i-line transmittance), the diamines respectively represented by the formulas (18) and (19) are more preferable (from the viewpoint of achieving low water absorption), and the diamine represented by the formula (18) is particularly preferable.

The monovalent organic group that may be represented by $R^1$ and $R^2$ in the general formula (1) includes an alkyl group having 1 to 20 carbon atoms, a cycloalkyl group having 3 to 20 carbon atoms, an acryloxyalkyl group that includes an alkyl group having 1 to 10 carbon atoms, and a methacryloxyalkyl group that includes an alkyl group having 1 to 10 carbon atoms.

Examples of the alkyl group having 1 to 20 carbon atoms include a methyl group, an ethyl group, an n-propyl group, a 2-propyl group, an n-butyl group, an n-hexyl group, an n-heptyl group, an n-decyl group, an n-dodecyl group, and the like.

Examples of the cycloalkyl group having 3 to 20 carbon atoms include a cyclopropyl group, a cyclobutyl group, a cyclopentyl group, a cyclohexyl group, an adamantyl group, and the like.

Examples of the acryloxyalkyl group that includes an alkyl group having 1 to 10 carbon atoms include an acryloxyethyl group, an acryloxypropyl group, an acryloxybutyl group, and the like.

Examples of the methacryloxyalkyl group that includes an alkyl group having 1 to 10 carbon atoms include a methacryloxyethyl group, a methacryloxypropyl group, a methacryloxybutyl group, and the like.

It is preferable that at least one of $R^1$ and $R^2$ be a monovalent organic group that includes a carbon-carbon unsaturated double bond.

When the polyimide precursor includes the monovalent organic group that includes a carbon-carbon unsaturated double bond, radical polymerization occurs due to radicals generated by the compound that generates radicals when irradiated with active rays (e.g., i-line exposure), and the molecular chains can be crosslinked.

Examples of the monovalent organic group that includes a carbon-carbon unsaturated double bond include an acryloxyalkyl group that includes an alkyl group having 1 to 10 carbon atoms, and a methacryloxyalkyl group that includes an alkyl group having 1 to 10 carbon atoms.

Since the polyimide precursor according to the invention includes the structural unit represented by the general formula (1) in a ratio of 50 mol % or more based on the total structural units, the molecular chain of the polyimide becomes rigid, and exhibits reduced thermal expansion and reduced stress.

It is preferable that the polyimide precursor include the structural unit represented by the general formula (1) in a ratio of 60 mol % or more, and more preferably 70 mol % or more, based on the total structural units.

The upper limit of the ratio of the structural unit represented by the general formula (1) included in the polyimide precursor is not particularly limited, but may be 95 mol % or less based on the total structural units, for example.

The ratio of the structural unit represented by the general formula (1) can be adjusted to the above range by appropriately adjusting the amounts of the tetracarboxylic dianhydride and the diamine when producing (polymerizing) the polyimide precursor.

The polyimide precursor according to the invention may further include a structural unit (structure) represented by the following general formula (4) in addition to the structural unit (structure) represented by the following general formula (1) so that the i-line transmittance, adhesion after curing, and mechanical properties are improved.

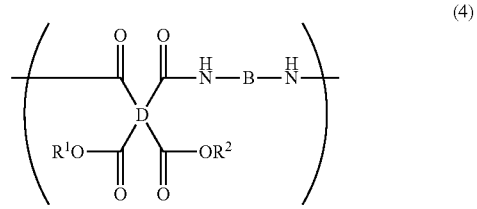

(4)

wherein D is a tetravalent organic group represented by the following general formula (5), and B, and $R^2$ are the same as defined above in connection with the general formula (1),

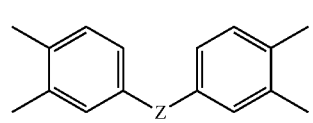

(5)

wherein Z is an ether bond (—O—) or a sulfide bond (—S—).

The moiety in the general formula (4) that includes Z is a structure derived from a tetracarboxylic dianhydride that is used as a raw material for producing the polyimide precursor. Examples of the tetracarboxylic dianhydride that produces the structure of the moiety that includes Z include 4,4'-oxydiphthalic dianhydride, thioetherdiphthalic anhydride, and the like. Among these, 4,4'-oxydiphthalic dianhydride is preferable from the viewpoint of adhesion after curing.

These tetracarboxylic dianhydrides may be used either alone or in combination of two or more when producing (polymerizing) the polyimide precursor.

B, $R^1$ and $R^2$ in the general formula (4) are the same as B, $R^1$, and $R^2$ in the general formula (1). The groups mentioned above that are preferable as B, $R^1$ and $R^2$ in the general formula (1) are also preferable as B, $R^1$ and $R^2$ in the general formula (4).

When the polyimide precursor includes the structural unit represented by the general formula (1) and the structural unit represented by the general formula (4), the polyimide precursor is a copolymer. When the polyimide precursor is a copolymer, the polyimide precursor may be a block copolymer, a random copolymer, or the like.

When the polyimide precursor includes the structural unit represented by the general formula (1) and the structural unit represented by the general formula (4), the molar ratio (structural unit represented by general formula (1)/structural unit represented by general formula (4)) of the structural unit represented by the general formula (1) to the structural unit represented by the general formula (4) is preferably 5/5 to 9/1, more preferably 6/4 to 9/1, and still more preferably 7/3 to 9/1, from the viewpoint of reducing stress, and improving the i-line transmittance.

The polyimide precursor according to the invention may include a structural unit (additional structural unit) other than the structural unit represented by the general formula (1) and the structural unit represented by the general formula (4).

Examples of a tetracarboxylic dianhydride that produces the additional structural unit include 4,4'-(hexafluoroisopropylidene)diphthalic anhydride, 3,3',4,4'-benzophenonetetracarboxylic dianhydride, 1,2,3,4-cyclobutanetetracarboxylic dianhydride, and the like. Examples of a diamine that produces the additional structural unit include p-phenylenediamine, 4,4'-oxydianiline, 2,2'-dimethylbenzidine, 4,4'-diaminodiphenylmethane, and the like.

It is preferable to use the tetracarboxylic dianhydride that produces the additional structural unit in a ratio of 20 mol % or less, and more preferably 10 mol % or less, based on the total amount of the tetracarboxylic dianhydride used as the raw material for producing the polyimide precursor, from the viewpoint of stress and i-line transmittance. It is still more preferable to use only the tetracarboxylic dianhydride that produces the structural unit (structure) represented by the general formula (1) and the tetracarboxylic dianhydride that produces the structural unit (structure) represented by the general formula (4) without using the tetracarboxylic dianhydride that produces the additional structural unit.

It is preferable to use the diamine that produces the additional structural unit in a ratio of 20 mol % or less, and more preferably 10 mol % or less, based on the total amount of the diamine. It is still more preferable to use only the diamine that produces the structural unit represented by the general formula (3).

The polystyrene-equivalent weight average molecular weight of the polyimide precursor according to the invention is preferably 10,000 to 100,000, more preferably 15,000 to 100,000, and still more preferably 20,000 to 85,000.

It is preferable that the polyimide precursor have a weight average molecular weight of 10,000 or more from the viewpoint of sufficiently reducing stress after curing. It is preferable that the polyimide precursor have a weight average molecular weight of 100,000 or less from the viewpoint of improving solubility in a solvent, and handling capability of the resulting solution.

Note that the weight average molecular weight may be measured by gel permeation chromatography, and may be converted using a standard polystyrene calibration curve.

Method for Producing Polyimide Precursor

The polyimide precursor according to the invention may be synthesized by subjecting a tetracarboxylic dianhydride and a diamine to addition polymerization.

The molar ratio (tetracarboxylic dianhydride/diamine) of the tetracarboxylic dianhydride to the diamine used when synthesizing the polyimide precursor is normally 1.0. It is preferable to set the molar ratio to 0.7 to 1.3 in order to control the molecular weight and a terminal residue. When the molar ratio is 0.7 to 1.3, the resulting polyimide precursor tends to have a moderate molecular weight, and exhibits sufficiently reduced stress after curing.

The polyimide precursor according to the invention may also be synthesized by producing a diester derivative represented by the following general formula (20) from the tetracarboxylic dianhydride (raw material), producing an acid chloride represented by the following general formula (21) from the diester derivative represented by the general formula (20), and condensing the acid chloride represented by the following general formula (21) and the diamine in the presence of a basic compound, for example.

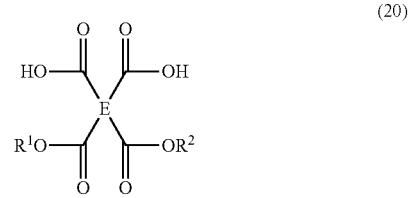

(20)

wherein E is a tetravalent organic group, and
$R^1$ and $R^2$ are the same as defined above in connection with the general formula (1).

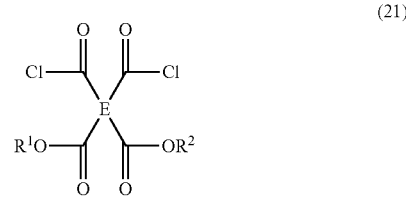

(21)

wherein E is a tetravalent organic group, and
$R^1$ and $R^2$ are the same as defined above in connection with the general formula (1).

E in the general formulas (20) and (21) corresponds to A in the general formula (1), or Z and the two benzene rings in the general formula (4).

The diester derivative represented by the general formula (20) may be synthesized by reacting 1 mol of the tetracarboxylic dianhydride (raw material) with 2 molar equivalents or more of an alcohol in the presence of a basic catalyst.

If unreacted alcohol remains when producing the acid chloride represented by the general formula (21) from the diester derivative represented by the general formula (20), a chlorinating agent may react with the unreacted alcohol, and conversion into the acid chloride may not proceed sufficiently. Therefore, it is preferable to use the alcohol in an amount of 2.0 to 2.5 molar equivalents, more preferably 2.0 to 2.3 molar equivalents, and still more preferably 2.0 to 2.2 molar equivalents, based on 1 mol of the tetracarboxylic dianhydride.

Examples of the alcohol that is reacted with the tetracarboxylic dianhydride include an alcohol that includes an alkyl group having 1 to 20 carbon atoms, an alcohol that includes a cycloalkyl group having 3 to 20 carbon atoms, an alcohol that includes an acryloxyalkyl group that includes an alkyl group having 1 to 10 carbon atoms, and an alcohol that includes a methacryloxyalkyl group that includes an alkyl group having 1 to 10 carbon atoms.

Specific examples of the alcohol include methanol, ethanol, n-propanol, isopropanol, n-butanol, 2-butanol, t-butanol, hexanol, cyclohexanol, 2-hydroxyethyl acrylate, 2-hydroxyethyl methacrylate, 2-hydroxypropyl acrylate, 2-hydroxypropyl methacrylate, 2-hydroxybutyl acrylate, 2-hydroxybutyl methacrylate, 4-hydroxybutyl acrylate, 4-hydroxybutyl methacrylate, and the like. These alcohols may be used either alone or in combination of two or more.

Examples of the basic catalyst used when reacting the tetracarboxylic dianhydride with the alcohol include 1,8-diazabicyclo[5.4.0]undec-7-ene, 1,5-diazabicyclo[4.3.0]nona-5-ene, and the like.

When using two or more tetracarboxylic dianhydrides as the raw material, ester derivatives may be separately produced from these tetracarboxylic dianhydrides, and mixed. Alternatively, two or more tetracarboxylic dianhydrides may be mixed in advance, and ester derivatives may be simultaneously produced from these tetracarboxylic dianhydrides.

When producing the acid chloride represented by the general formula (21) from the diester derivative represented by the general formula (20), 2 molar equivalents of a chlorinating agent is normally reacted with 1 mol of the diester derivative. The amount (equivalent) of the chlorinating agent may be appropriately adjusted in order to control the molecular weight of the resulting polyimide precursor.

Thionyl chloride or dichlorooxalic acid may be used as the chlorinating agent. The chlorinating agent is preferably used in an amount of 1.5 to 2.5 molar equivalents, more preferably 1.6 to 2.4 molar equivalents, and still more preferably 1.7 to 2.3 molar equivalents. It is preferable to use the chlorinating agent in an amount of 1.5 to 2.5 molar equivalents from the viewpoint of increasing the molecular weight of the polyimide precursor, and reducing stress after curing.

The diamine is added to the acid chloride represented by the general formula (21) in the presence of the basic compound to obtain the polyimide precursor according to the invention. The basic compound is used to trap hydrogen chloride that is produced when the acid chloride reacts with the diamine.

Pyridine, 4-dimethylaminopyridine, triethylamine, or the like may be used as the basic compound. The basic compound is preferably used in a 1.5 to 2.5-fold amount (mol), more preferably 1.7 to 2.4-fold amount, and still more preferably 1.8 to 2.3-fold amount, with respect to the amount of the chlorinating agent. It is preferable to use the basic compound in a 1.5 to 2.5-fold amount from the viewpoint of increasing the molecular weight of the polyimide precursor, and reducing stress after curing.

It is preferable to effect the addition polymerization, the condensation reaction, synthesis of the diester derivative, and synthesis of the acid chloride in an organic solvent.

It is preferable to use a polar solvent that can completely dissolve the resulting polyimide precursor as the organic solvent. Examples of the polar solvent include N-methyl-2-pyrrolidone, N,N-dimethylacetamide, N,N-dimethylformamide, dimethyl sulfoxide, tetramethylurea, hexamethylphosphoric acid triamide, and γ-butyrolactone, and the like.

Photosensitive Resin Composition

The photosensitive resin composition according to the invention includes the following components (a) to (c).
(a) Polyimide precursor according to the invention
(b) Compound that generates radicals when irradiated with active rays
(c) Solvent The details of the polyimide precursor according to the invention that is used as the component (a) are the same as described above.

The content of the polyimide precursor in the photosensitive resin composition is preferably 20 to 60 mass %, more preferably 25 to 55 mass %, and still more preferably 30 to 55 mass %.

Compound that generates radicals when irradiated with active rays

Examples of the compound that generates radicals when irradiated with active rays that is used as the component (b) include an aromatic ketone such as an oxime ester compound described below, benzophenone, an N,N'-tetraalkyl-4,4'-diaminobenzophenone such as N,N'-tetramethyl-4,4'-diaminobenzophenone (Michler's ketone), 2-benzyl-2-dimethylamino-1-(4-morpholinophenyl)butanone-1, and 2-methyl-1-[4-(methylthio)phenyl]-2-morpholinopropanone-1; a quinone fused with an aromatic ring (e.g., alkylanthraquinone); a benzoin ether compound such as a benzoin alkyl ether; a benzoin compound such as benzoin and an alkylbenzoin; and a benzyl derivative such as benzyldimethylketal.

Among these, the oxime ester compound is preferable due to excellent sensitivity and capability to form an excellent pattern.

It is preferable that the oxime ester compound be a compound represented by the following general formula (22), a compound represented by the following general formula (23), or a compound represented by the following general formula (24), since excellent sensitivity and a high residual film ratio can be obtained.

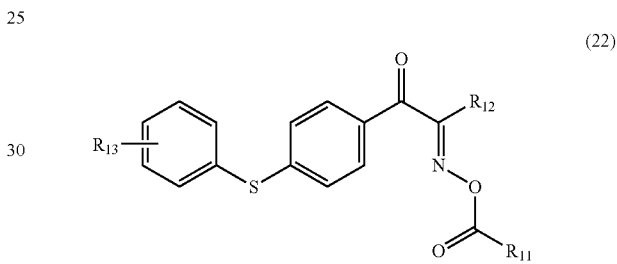

(22)

$R_{11}$ and $R_{12}$ in the general formula (22) are independently an alkyl group having 1 to 12 carbon atoms, a cycloalkyl group having 4 to 10 carbon atoms, or a phenyl group, preferably an alkyl group having 1 to 8 carbon atoms, a cycloalkyl group having 4 to 6 carbon atoms, or a phenyl group, more preferably an alkyl group having 1 to 4 carbon atoms, a cycloalkyl group having 4 to 6 carbon atoms, or a phenyl group, and still more preferably a methyl group, a cyclopentyl group, or a phenyl group.

$R_{13}$ is —H, —OH, —COON, —O(CH$_2$)OH, —O(CH$_2$)$_2$OH, —COO(CH$_2$)OH, or —COO(CH$_2$)$_2$OH, preferably —H, —O(CH$_2$)OH, —O(CH$_2$)$_2$OH, —COO(CH$_2$)OH, or —COO(CH$_2$)$_2$OH, and more preferably —H, —O(CH$_2$)$_2$OH, or —COO(CH$_2$)$_2$OH.

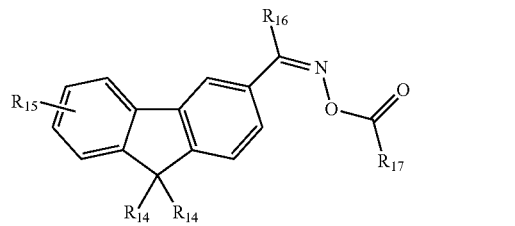

(23)

$R_{14}$ in the general formula (23) are independently an alkyl group having 1 to 6 carbon atoms, and preferably a propyl group.

$R_{15}$ is NO$_2$ or ArCO (wherein Ar is an aryl group). Ar is preferably a tolyl group.

$R_{16}$ and $R_{17}$ are independently an alkyl group having 1 to 12 carbon atoms, a phenyl group, or a tolyl group, and preferably a methyl group, a phenyl group, or a tolyl group.

(24)

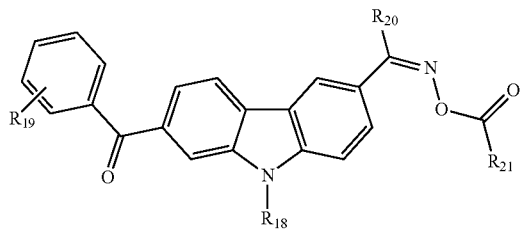

$R_{18}$ in the general formula (24) is an alkyl group having 1 to 6 carbon atoms, and preferably an ethyl group.

$R_{19}$ is an organic group that includes an acetal bond, and preferably a substituent that corresponds to $R_{19}$ included in the compound represented the general formula (24-1) described later.

$R_{20}$ and $R_{21}$ are independently an alkyl group having 1 to 12 carbon atoms, a phenyl group, or a tolyl group, preferably a methyl group, a phenyl group, or a tolyl group, and more preferably a methyl group.

Examples of the compound represented by the general formula (22) include the compound represented by the following formula (22-1) and the compound represented by the following formula (22-2). The compound represented by the formula (22-1) is available as IRGACURE OXE-01 (manufactured by BASF).

(22-1)

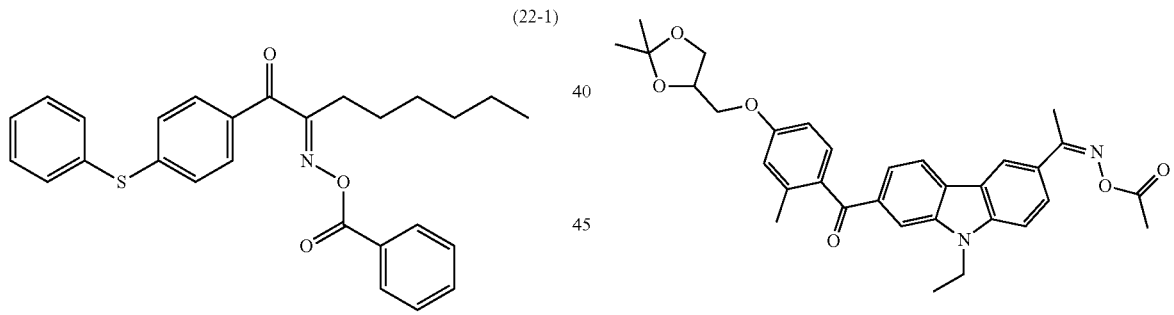

(22-2)

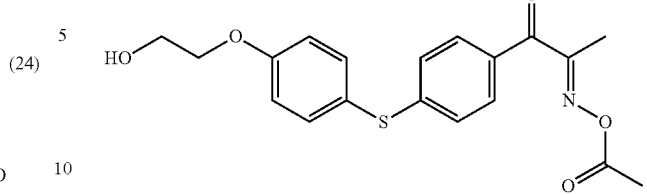

Examples of the compound represented by the general formula (23) include the compound represented by the following formula (23-1). The compound represented by the formula (23-1) is available as DFI-091 (manufactured by Daito Chemix Corporation).

(23-1)

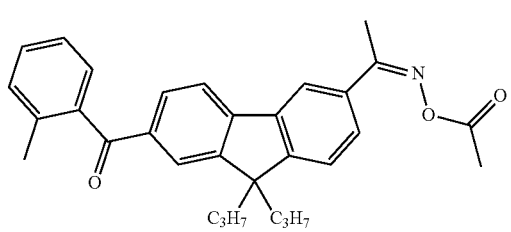

Examples of the compound represented by the general formula (24) include the compound represented by the following formula (24-1). The compound represented by the formula (24-1) is available as Adekaoptomer N-1919 (manufactured by Adeka Corporation).

(24-1)

The compound shown below is also preferable as the oxime ester compound.

(25)

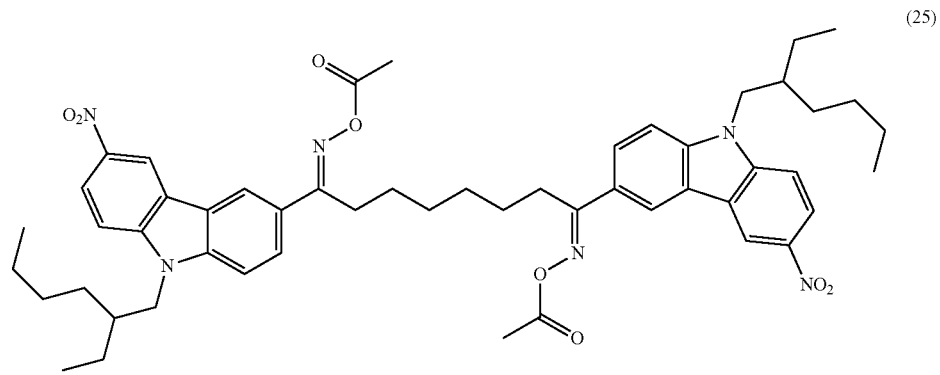 [SMILES: CCCCC(CC)Cn1c2ccc(/C(CCCCCC/C(=N\OC(C)=O)c3ccc4c(c3)c3cc([N+](=O)[O-])ccc3n4CC(CC)CCCC)=N/OC(C)=O)cc2c2cc([N+](=O)[O-])ccc21]

These compounds that generate radicals when irradiated with active rays may be used either alone or in combination of two or more.

The compound that generates radicals when irradiated with active rays is preferably used in an amount of 0.01 to 10 parts by weight, more preferably 0.01 to 5 parts by weight, and still more preferably 0.05 to 3 parts by weight, based on 100 parts by weight of the polyimide precursor (component (a)). When the amount of the compound that generates radicals when irradiated with active rays is 0.01 parts by weight or more, a crosslinking reaction more sufficiently proceeds in the exposed area, and the photosensitivity (sensitivity and resolution) of the composition tends to be improved. When the amount of the compound that generates radicals when irradiated with active rays is 10 parts by weight or less, the heat resistance of the resulting cured film can be improved.

It is preferable to use a polar solvent that can completely dissolve the polyimide precursor (component (a)) as the solvent (component (c)). Examples of the polar solvent include N-methyl-2-pyrrolidone, N,N-dimethylacetamide, N,N-dimethylformamide, dimethyl sulfoxide, tetramethylurea, hexamethylphosphoric acid triamide, and γ-butyrolactone, 5-valerolactone, γ-valerolactone, cyclohexanone, cyclopentanone, propylene glycol monomethyl ether acetate, propylene carbonate, ethyl lactate, 1,3-dimethyl-2-imidazolidinone, and the like. These solvents may be used either alone or in combination of two or more.

The content of the solvent in the photosensitive resin composition is preferably 40 to 80 mass %, more preferably 45 to 75 mass %, and still more preferably 45 to 70 mass %.

The photosensitive resin composition may further include an additional component (see below) as long as the photosensitive resin composition includes the polyimide precursor (component (a)), the compound that generates radicals when irradiated with active rays (component (b)), and the solvent (component (c)).

The photosensitive resin composition according to the invention may include (d) an organosilane compound so that adhesion to a silicon substrate or the like after curing is improved.

Examples of the organosilane compound include γ-aminopropyltrimethoxysilane, γ-aminopropyltriethoxysilane, vinyltriethoxysilane, vinyltrimethoxysilane, γ-glycidoxypropyltriethoxysilane, γ-glycidoxypropyltrimethoxysilane, γ-methacryloxypropyltrimethoxysilane, γ-acryloxypropyltrimethoxysilane, 3-ureidopropyltriethoxysilane, 3-mercaptopropyltrimethoxysilane, 3-isocyanatopropyltriethoxysilane, bis(2-hydroxyethyl)-3-aminopropyltriethoxysilane, triethoxysilylpropylethyl carbamate, 3-(triethoxysilyl)propylsuccinic anhydride, phenyltriethoxysilane, phenyltrimethoxysilane, N-phenyl-3-aminopropyltrimethoxysilane, 3-triethoxysilyl-N-(1,3-dimethylbutylidene)propylamine, 2-(3,4-epoxycyclohexyl)ethyltrimethoxysilane, and the like.

When the photosensitive resin composition includes the organosilane compound, the content of the organosilane compound is preferably 0.1 to 20 parts by weight, more preferably 0.5 to 15 parts by weight, and still more preferably 0.5 to 10 parts by weight, based on 100 parts by weight of the polyimide precursor, from the viewpoint of adhesion after curing.

The photosensitive resin composition according to the invention may optionally include (e) an addition-polymerizable compound.

Examples of the addition-polymerizable compound include diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, 1,4-butanediol diacrylate, 1,6-hexanediol diacrylate, 1,4-butanediol dimethacrylate, 1,6-hexanediol dimethacrylate, pentaerythritol triacrylate, pentaerythritol tetraacrylate, pentaerythritol trimethacrylate, pentaerythritol tetramethacrylate, styrene, divinylbenzene, 4-vinyltoluene, 4-vinylpyridine, N-vinylpyrrolidone, 2-hydroxyethyl methacrylate, 2-hydroxyethyl acrylate, 1,3-acryloyloxy-2-hydroxypropane, 1,3-methacryloyloxy-2-hydroxypropane, methylenebisacrylamide, N,N-dimethylacrylamide, N-methylolacrylamide, and the like.

These addition-polymerizable compounds may be used either alone or in combination of two or more of two or more.

When the photosensitive resin composition includes the addition-polymerizable compound, the content of the addition-polymerizable compound is preferably 1 to 100 parts by weight, more preferably 1 to 75 parts by weight, and still more preferably 1 to 50 parts by weight, based on 100 parts by weight of the polyimide precursor, from the viewpoint of solubility in a developer, and the heat resistance of the resulting cured film.

The photosensitive resin composition according to the invention may include (f) a radical polymerization inhibitor or a radical polymerization retarder so that the photosensitive resin composition exhibits excellent storage stability.

Examples of the radical polymerization inhibitor or the radical polymerization retarder include p-methoxyphenol, diphenyl-p-benzoquinone, benzoquinone, hydroquinone, pyrogallol, phenothiazine, resorcinol, o-dinitrobenzene, p-dinitrobenzene, m-dinitrobenzene, phenanthraquinone, N-phenyl-2-naphthylamine, cupferron, 2,5-toluquinone, tannic acid, p-benzylaminophenol, a nitrosoamine, and the like. These compounds may be used either alone or in combination of two or more.

When the photosensitive resin composition includes the radical polymerization inhibitor or the radical polymerization retarder, the content of the radical polymerization inhibitor or the radical polymerization retarder is preferably 0.01 to 30 parts by weight, more preferably 0.01 to 10 parts by weight, and still more preferably 0.05 to 5 parts by weight, based on 100 parts by weight of the polyimide precursor, from the viewpoint of the storage stability of the photosensitive resin composition, and the heat resistance of the resulting cured film.

When the photosensitive resin composition according to the invention is used for (applied to) a copper substrate, it is preferable that the photosensitive resin composition include (g) tetrazole or a tetrazole derivative, or benzotriazole or a benzotriazole derivative.

When the photosensitive resin composition according to the invention is used for (applied to) a copper substrate (e.g., a redistribution layer 6 illustrated in FIG. 1 described later), and includes the oxime ester compound represented by the above-mentioned general formula (22) (e.g., IRGACURE OXE-01 (manufactured by BASF)), a polyimide residue may remain in an opening when forming a patterned cured film. The inventors of the invention assume that the above phenomenon occurs because a specific oxime ester compound generates radicals on the copper substrate during prebaking, and the unexposed area is also cured. In order to solve the above problem, it is preferable to incorporate the component (g) in the photosensitive resin composition.

When the photosensitive resin composition includes the component (g), it is possible to suppress a situation in which a polyimide residue remains in an opening.

A specific mechanism by which the component (g) exhibits the above effect is not clear. It is assumed that the component (g) forms a thin film on the copper substrate, and prevents a situation in which the resin composition comes in direct contact with the active metal surface, so that undesirable decomposition of a photoinitiator and a radical polymerization reaction in the unexposed area are suppressed, and photosensitivity can be achieved on the copper substrate.

Examples of tetrazole and the tetrazole derivative include 1H-tetrazole, 5-methyl-1H-tetrazole, 5-phenyl-1H-tetrazole, 5-amino-1H-tetrazole, 1-methyl-1H-tetrazole, 5,5'-bis-1H-tetrazole, 1-methyl-5-ethyltetrazole, 1-methyl-5-mercaptotetrazole, 1-carboxymethyl-5-mercaptotetrazole, and the like.

Among these, 1H-tetrazole and 5-amino-1H-tetrazole are preferable.

Examples of benzotriazole and the benzotriazole derivative include benzotriazole, 1H-benzotriazole-1-acetonitrile, benzotriazole-5-carboxylic acid, 1H-benzotriazole-1-methanol, carboxybenzotriazole, mercaptobenzoxazole, and the like.

Among these, benzotriazole is preferable.

These compounds may be used either alone or in combination of two or more as the component (g).

The component (g) is normally used in an amount of 0.1 to 10 parts by weight for each kind based on 100 parts by weight of the component (a). When using two or more compounds as the component (g), the component (g) is used in an amount of 0.1 to 10 parts by weight in total based on 100 parts by weight of the component (a). The component (g) is preferably used in an amount of 0.2 to 5 parts by weight. If the amount of the component (g) is less than 0.1 parts by weight, the effect of improving adhesion to a metal layer may deteriorate.

The photosensitive resin composition according to the invention includes the components (a) to (c), and optionally includes one or more components selected from the components (d) to (g). The photosensitive resin composition according to the invention may essentially consist of these components, or may consist only of these components.

The expression "essentially consist of" means that the total content of the components (a) to (c) and the components (d) to (g) in the photosensitive resin composition is 95 wt % or more, 97 wt % or more, 98 wt % or more, or 99 wt % or more, for example.

Cured Film

A cured film is obtained by heating the polyimide precursor according to the invention to effect polyimidization.

For converting into polyimide, the polyimide precursor is preferably heated at 80 to 450° C., more preferably 100 to 450° C., and still more preferably 200 to 400° C. If the heating temperature is less than 80° C., polyimidization may not proceed sufficiently, and heat resistance may decrease. If the heating temperature exceeds 450° C., the resulting polyimide may deteriorate.

The residual stress of the cured film obtained by curing the polyimide precursor according to the invention is preferably 30 MPa or less, more preferably 27 MPa or less, and still more preferably 25 MPa or less. If the residual stress of the resulting cured film exceeds 30 MPa, a wafer may be warped to a large extent when the cured film is formed to have a thickness of 10 μm, and a problem may occur when transferring or securing (sucking) the wafer.

The residual stress of the cured film may be calculated from the following expression (I) using a change in radius of curvature of a silicon wafer before and after formation of a polyimide film.

Note that the radius of curvature of a silicon wafer is calculated from the reflection angle of laser light with which the silicon wafer is scanned, and may be measured using a thin film stress measurement device (e.g., FLX-2320 manufactured by KLA-Tencor).

$$\sigma = \frac{Eh^2}{(1-v)6Rt} \tag{I}$$

σ: Residual stress (Pa)
E/(1-v): Biaxial elastic modulus (Pa) of silicon wafer
h: Thickness (m) of silicon wafer
t: Thickness (m) of polyimide film
R: Change (m) in radius of curvature of silicon wafer When it is desired to form a polyimide film having a thickness of 10 μm by curing the polyimide precursor according to the invention, the polyimide precursor is applied to a thickness of about 20 μm, for example.

When a polyimide precursor resin film obtained by applying a polyimide precursor solution to a substrate, and drying the solution has a thickness of 20 μm, it is preferable that the i-line transmittance of the resin film be 5% or more, more preferably 8% or more, still more preferably 15% or more, and particularly preferably 30% or more. If the i-line transmittance is less than 5%, an i-line may not reach a deep area, and radicals may not be sufficiently generated, whereby photosensitivity may deteriorate.

Note that the i-line transmittance may be measured using a method that applies the polyimide precursor to a glass substrate, dries the applied polyimide precursor, and measures the i-line transmittance using a UV spectrophotometer.

Patterned Cured Film

The patterned cured film according to the invention is obtained by exposing and heating the photosensitive resin composition according to the invention. The patterned cured film according to the invention is preferably used as a protective layer for a low-K material (i.e., interlayer insulating film). Examples of the low-K material include porous silica, benzocyclobutene, hydrogen silsesquioxane, a polyaryl ether, and the like.

The method for producing a patterned cured film according to the invention includes: applying the photosensitive resin composition according to the invention to a substrate, and drying the applied photosensitive resin composition to form a film; exposing the film in a pattern by applying active rays to the film; removing an unexposed area of the film by development to obtain a patterned resin film; and heating the patterned resin film.

When applying the photosensitive resin composition that includes the polyimide precursor to the substrate, and drying the photosensitive resin composition to form a film, the photosensitive resin composition may be applied to the substrate using a dipping method, a spray method, a screen printing method, a spin coating method, or the like.

Examples of the substrate include a silicon wafer, a metal substrate, a ceramic substrate, and the like. Since the photosensitive resin composition that includes the polyimide precursor according to the invention can form a cured film that exhibits low stress, the photosensitive resin composition may particularly suitably be applied to a large silicon wafer having a diameter of 12 inches or more.

A film (resin film) that exhibits low adhesion can be formed by applying the photosensitive resin composition to the substrate, and removing the solvent by heating (drying).

Note that the drying temperature (heating temperature) is preferably 80 to 130° C., and the drying time is preferably 30 to 300 seconds. It is preferable to dry the composition using a device such as a hot plate.

When exposing the film in a pattern by applying active rays, and removing the unexposed area of the film by development to obtain the patterned resin film, the film is exposed in a pattern by applying active rays to the film through a mask having the desired pattern.

The photosensitive resin composition according to the invention is suitable for i-line exposure. Ultraviolet rays, deep ultraviolet rays, visible light, electron beams, X-rays, or the like may be used as the active rays.

The desired pattern can be obtained by dissolving (removing) the unexposed area in an appropriate developer after exposure.

The developer is not particularly limited. Examples of the developer include a flame-retardant solvent such as 1,1,1-trichloroethane; an alkaline aqueous solution such as a sodium carbonate aqueous solution and a tetramethylammonium hydroxide aqueous solution; a good solvent such as N,N-dimethylformamide, dimethyl sulfoxide, N,N-dimethylacetamide, N-methyl-2-pyrrolidone, cyclopentanone, γ-butyrolactone, and an acetic acid ester; a mixed solvent that includes the good solvent and a poor solvent such as a lower alcohol, water, or an aromatic hydrocarbon; and the like.

After development, the patterned resin film is optionally rinsed with a poor solvent (e.g., water, ethanol, or 2-propanol), or the like.

When heating the patterned resin film, the patterned resin film is heated at 80 to 400° C. for 5 to 300 minutes to imidize the polyimide precursor included in the photosensitive resin composition to obtain a patterned cured film.

It is preferable to heat the patterned resin film using a curing furnace that can maintain a low oxygen concentration of 100 ppm or less in order to suppress oxidative degradation of the polyimide during heating. For example, an inert gas oven or a vertical diffusion furnace may be used.

Application (Usage) Example of Cured Film or Patterned Cured Film

The cured film or the patterned cured film according to the invention may be used as a surface protective layer, an interlayer insulating layer, a redistribution layer, and the like used for a semiconductor device. Examples of the semiconductor device include a logic semiconductor device such as an MPU, a memory semiconductor device such as a DRAM and a NAND flash, and the like.

FIG. 1 is a schematic cross-sectional view illustrating a semiconductor device according to one embodiment of the invention that includes a redistribution structure. The semiconductor device according to this embodiment has a multilayer wiring structure. An Al wiring layer 2 is formed on an interlayer insulating layer (interlayer insulating film) 1. An insulating layer (insulating film) 3 (e.g., P—SiN layer) is formed on the Al wiring layer 2, and a surface protective layer (surface protective film) 4 is formed on the insulating layer 3. A redistribution layer 6 is formed from a pad 5 of the wiring layer 2. The redistribution layer 6 extends to the upper side of a core 8 that is connected to a conductive ball 7 (external connection terminal) that is formed of solder, gold, or the like. A cover coat layer 9 is formed on the surface protective layer 4. The redistribution layer 6 is connected to the conductive ball 7 through a barrier metal 10. A collar 11 is provided to hold the conductive ball 7.

When mounting a package having such a structure, an underfill 12 may be provided to further reduce stress.

The cured film or the patterned cured film according to the invention may be used for package applications (e.g., cover coat material, redistribution core material, ball (solder) collar material, and underfill material) in the above-mentioned embodiment.

Since the cured film or the patterned cured film according to the invention exhibits excellent adhesion to a metal layer, a sealing material, and the like, exhibits excellent copper migration resistance, and has a high stress relaxation effect, the semiconductor device that includes the cured film or the patterned cured film according to the invention has high reliability.

EXAMPLES

The invention is further described below by way of examples and comparative examples. Note that the invention is not limited to the following examples.

Examples 1 to 6 and Comparative Examples 1 to 5

Synthesis and Evaluation of Polyamic Acid

A tetracarboxylic dianhydride 1 shown in Table 1 was dissolved in 150 ml of N-methyl-2-pyrrolidone at room temperature with stirring optionally together with a tetracarboxylic acid 2 shown in Table 1. After the addition of a diamine 1 shown in Table 1 optionally together with a diamine 2 shown in Table 1, the mixture was stirred at room temperature for 1 hour to obtain a polyamic acid solution (polyimide precursor solution).

The resulting polyimide precursor was evaluated as described below. The results are shown in Table 1.
(1) Weight Average Molecular Weight The weight average molecular weight (standard polystyrene-equivalent value) of the resulting polyamic acid was determined by gel permeation chromatography (GPC). The results are shown in Table 1.

Specifically, the weight average molecular weight of the polyamic acid was determined by GPC under the following measurement conditions using a solution prepared by dissolving 0.5 mg of the polyamic acid in 1 ml of a solvent (THF/DMF=1/1 (volume ratio)).
Measurement apparatus: detector: L4000 UV manufactured by Hitachi, Ltd.
Pump: L6000 manufactured by Hitachi Ltd.
C-R4A Chromatopac manufactured by Shimadzu Corporation
Measurement conditions: Column Gelpack GL-S300MDT-5×2
Eluent: THF/DMF=1/1 (volume ratio)
LiBr (0.03 mol/l), $H_3PO_4$ (0.06 mol/l)
Flow rate: 1.0 ml/min
Detector: UV 270 nm
(2) i-line Transmittance A solution of the resulting polyamic acid was spin-coated onto a glass substrate, and heated at 100° C. for 3 minutes on a hot plate to form a coated film having thickness of 20 μm. The i-line transmittance (365 nm) of the coated film was measured, and evaluated in accordance with the following standard. The results are shown in Table 1.
Good: The i-line transmittance was 20% or more.
Fair: The i-line transmittance was 10% or more and less than 20%.
Bad: The i-line transmittance was less than 10%.

Note that the i-line transmittance was measured by a cast film method using a UV-visible spectrophotometer (U-3310 manufactured by Hitachi High-Technologies Corporation).

(3) Residual Stress

A solution of the resulting polyamic acid was spin-coated onto a 6-inch silicon wafer (thickness: 625 μm) so that the film thickness after curing was 10 μm. The solution of the polyamic acid was heated and cured at 375° C. for 1 hour in a nitrogen atmosphere using a vertical diffusion furnace (manufactured by Koyo Lindberg Co., Ltd.) to obtain a polyimide film. The residual stress of the polyimide film was measured, and evaluated in accordance with the following standard. The results are shown in Table 1.

Good: The residual stress was 30 MPa or less.
Fair: The residual stress was more than 30 MPa and 35 MPa or less.
Bad: The residual stress was more than 35 MPa.

Note that the residual stress of the cured film was measured at room temperature using a thin film stress measurement device (FLX-2320 manufactured by KLA-Tencor).

(4) Water Absorption

The cured film (polyimide film) formed on the silicon wafer for which the residual stress had been measured, was immersed in a hydrofluoric acid aqueous solution to remove the polyimide film from the silicon wafer.

After immersing the polyimide film in purified water at room temperature for 24 hours, 10 mg of a sample was cut from the polyimide film, and placed in a thermogravimetry/differential thermal analyzer (TG/DTA7000 manufactured by SII NanoTechnology Inc.). The sample was heated from room temperature to 150° C. at a temperature increase rate of 200° C./min, and allowed to stand at 150° C. for 30 minutes, and then the weight of the sample was measured. A value calculated by dividing the reduction in weight from the initial weight by the initial weight was taken as the water absorption, and evaluated in accordance with the following standard. The results are shown in Table 1

Good: The water absorption was 1% or less.
Fair: The water absorption was more than 1% and 2% or less.
Bad: The water absorption was more than 2%.

TABLE 1

| | Example | | | | | |
|---|---|---|---|---|---|---|
| | 1 | 2 | 3 | 4 | 5 | 6 |
| Tetracarboxylic dianhydride 1 | PMDA 21.81 g (100 mmol) | NTCA 26.82 g (100 mmol) | MMXDA 35.03 g (100 mmol) | PMDA 16.36 g (75 mmol) | PMDA 13.09 g (60 mmol) | MMXDA 26.27 g (75 mmol) |
| Tetracarboxylic dianhydride 2 | — | — | — | ODPA 7.76 g (25 mmol) | ODPA 12.41 g (40 mmol) | ODPA 7.76 g (25 mmol) |
| Diamine 1 | TFDB 32.02 g (100 mmol) | TFDB 32.02 g (100 mmol) | TFDB 32.02 g (100 mmol) | TFDB 32.02 g (100 mmol) | TFDB 32.02 g (100 mmol) | TFDB 32.02 g (100 mmol) |
| Diamine 2 | — | — | — | — | — | — |
| Ratio (mol %) of structural unit represented by general formula (1) based on total structural units | 100 | 100 | 100 | 75 | 60 | 75 |
| Weight average molecular weight | 69000 | 60000 | 70000 | 85500 | 107000 | 80000 |
| i-line transmittance | Good | Good | Good | Good | Good | Good |
| Residual stress | Good | Good | Good | Good | Good | Good |
| Water absorption | Good | Good | Good | Good | Good | Good |

| | Comparative Example | | | | |
|---|---|---|---|---|---|
| | 1 | 2 | 3 | 4 | 5 |
| Tetracarboxylic dianhydride 1 | PMDA 21.81 g (100 mmol) | PMDA 16.36 g (75 mmol) | ODPA 31.02 g (100 mmol) | ODPA 31.02 g (100 mmol) | s-BPDA 29.42 g (100 mmol) |
| Tetracarboxylic dianhydride 2 | — | ODPA 7.76 g (25 mmol) | — | — | — |
| Diamine 1 | DMAP 21.23 g (100 mmol) | TFDB 8.01 g (25 mmol) | TFDB 32.02 g (100 mmol) | DMAP 21.23 g (100 mmol) | TFDB 16.01 g (50 mmol) |
| Diamine 2 | — | DMAP 15.92 g (75 mmol) | — | — | DMAP 10.61 g (50 mmol) |
| Ratio (mol %) of structural unit represented by general formula (1) based on total structural units | 0 | 25 | 0 | 0 | 0 |

TABLE 1-continued

| | | | | | |
|---|---|---|---|---|---|
| Weight average molecular weight | 75000 | 84000 | 65000 | 66900 | 50000 |
| i-line transmittance | Bad | Bad | Good | Good | Bad |
| Residual stress | Good | Good | Bad | Bad | Good |
| Water absorption | Fair | Fair | Good | Bad | Fair |

The details of each component shown in Table 1 are shown below.
PMDA: pyromellitic dianhydride
s-BPDA: 4,4'-biphenyltetracarboxylic dianhydride
NTCA: 2,3,6,7-naphthalenetetracarboxylic dianhydride
MMXDA: 9,9'-dimethyl-2,3,6,7-xanthenetetracarboxylic dianhydride
ODPA: 4.4'-oxydiphthalic dianhydride
TFDB: 2,2'-bis(trifluoromethyl)benzidine
DMAP: 2,2'-dimethylbenzidine As shown in Table 1, an i-line transmittance of 20% or more and a stress of 30 MPa or less were obtained in Examples 1 to 6. In Comparative Example 1 in which a diamine that does not include a fluorine atom was used, and Comparative Examples 2 and 5 in which a diamine that includes a fluorine atom and a diamine that does not include a fluorine atom were used in combination of two or more, the stress was 30 MPa or less, but the i-line transmittance was low. In Comparative Examples 3 and 4 in which a specific acid dianhydride corresponding to the polyimide precursor according to the invention was not used, the i-line transmittance was 20% or more, but the stress was 35 MPa or more.

Examples 7 to 12 and Comparative Examples 6 to 9

Synthesis and Evaluation of Polyamic Acid Ester (Polyimide Precursor)

A polyamic acid ester was synthesized by the following polyamic acid ester synthesis method 1 or 2 using a tetracarboxylic dianhydride 1, an alcohol compound 1, and a diamine 1 shown in Table 2 optionally together with a tetracarboxylic dianhydride 2, an alcohol compound 2, and a diamine 2 shown in Table 2.

The resulting polyamic acid ester (polyimide precursor) was evaluated in the same manner as in Examples 1 to 6 and Comparative Examples 1 to 5. The results are shown in Table 2.

(i) Polyamic Acid Ester Synthesis Method 1

The tetracarboxylic dianhydride 1 (see Table 2), the alcohol compound 1 (see Table 2), and 1,8-diazabicyclo[5.4.0]undec-7ene (DBU) (catalytic quantity) were dissolved in N-methyl-2-pyrrolidone (in a 4-fold amount (weight ratio) with respect to the tetracarboxylic dianhydride 1), and the solution was stirred at room temperature for 48 hours to obtain an ester solution 1.

The tetracarboxylic dianhydride 2 (see Table 2), the alcohol compound 2 (see Table 2), and DBU (catalytic quantity) were optionally dissolved in N-methyl-2-pyrrolidone (in a 4-fold amount (weight ratio) with respect to the tetracarboxylic dianhydride 2), and the solution was stirred at room temperature for 48 hours to obtain an ester solution 2.

After mixing the ester solution 1 and the ester solution 2, thionyl chloride (in an amount of 2.2-fold molar equivalents with respect to the total amount of the tetracarboxylic dianhydride 1 and the tetracarboxylic dianhydride 2) was added dropwise to the mixture while cooling the mixture in an ice bath, and the resulting mixture was stirred for 1 hour to prepare an acid chloride solution.

Separately, a solution was prepared by dissolving the diamine 1 (see Table 2), the diamine 2 (optional) (see Table 2), and pyridine (in an amount of 2-fold molar equivalents with respect to thionyl chloride) in N-methyl-2-pyrrolidone (in a 4-fold amount (weight ratio) with respect to the diamine 1 and the diamine 2). The solution was added dropwise to the acid chloride solution which had been prepared while cooling the acid chloride solution in an ice bath. After the dropwise addition, the reaction liquid was added dropwise to distilled water.

After the dropwise addition, a precipitate was collected by filtration, washed several times with distilled water, and dried under vacuum to obtain a polyamic acid ester. 100 parts by weight of the resulting polyamic acid ester was dissolved in 150 parts by weight of N-methyl-2-pyrrolidone to prepare a polyamic acid ester solution.

(ii) Polyamic Acid Ester Synthesis Method 2

A polyamic acid ester was obtained in the same manner as the polyamic acid ester synthesis method 1, except that the tetracarboxylic dianhydride 1 and the tetracarboxylic dianhydride 2 were esterified in the same reaction vessel, not separately.

100 parts by weight of the resulting polyamic acid ester was dissolved in 150 parts by weight of N-methyl-2-pyrrolidone to prepare a polyamic acid ester solution.

TABLE 2

| | | Example | | | | |
|---|---|---|---|---|---|---|
| item | | 7 | 8 | 9 | 10 | 11 |
| Tetracarboxylic dianhydride 1 | | PMDA 16.36 g (75 mmol) | PMDA 16.36 g (75 mmol) | PMDA 16.36 g (75 mmol) | PMDA 16.36 g (75 mmol) | MMXDA 26.27 g (75 mmol) |
| Alcohol compound 1 | | HEMA 19.52 g (150 mmol) | HEMA 19.52 g (150 mmol) | HEMA 19.52 g (150 mmol) | HEMA 26.03 g (200 mmol) | HEMA 19.52 g (150 mmol) |

TABLE 2-continued

| Tetracarboxylic dianhydride 2 | ODPA 7.76 g (25 mmol) | ODPA 7.76 g (25 mmol) | ODPA 7.76 g (25 mmol) | ODPA 7.76 g (25 mmol) | ODPA 7.76 g (25 mmol) |
|---|---|---|---|---|---|
| Alcohol compound 2 | IPA 3.01 g (50 mmol) | HEMA 6.51 g (50 mmol) | HEMA 6.51 g (50 mmol) | — | HEMA 6.51 g (50 mmol) |
| Diamine 1 | TFDB 32.02 g (100 mmol) | TFDB 32.02 g (100 mmol) | TFDB 28.81 g (90 mmol) | TFDB 32.02 g (100 mmol) | TFDB 32.02 g (100 mmol) |
| Diamine 2 | — | — | — | — | — |
| Ratio of structural unit represented by general formula (1) based on total structural units | 75 | 75 | 75 | 75 | 75 |
| Synthesis method | 1 | 1 | 1 | 2 | 1 |
| Weight average molecular weight | 36000 | 33000 | 11700 | 34300 | 54000 |
| i-line transmittance | Good | Good | Good | Good | Good |
| Residual stress | Good | Good | Good | Good | Good |
| Water absorption | Good | Good | Good | Good | Good |

| | Example | Comparative Example | | | |
|---|---|---|---|---|---|
| item | 12 | 6 | 7 | 8 | 9 |
| Tetracarboxylic dianhydride 1 | PMDA 17.45 g (80 mmol) | PMDA 21.81 g (100 mmol) | PMDA 16.36 g (75 mmol) | ODPA 31.02 g (100 mmol) | s-BPDA 29.42 g (100 mmol) |
| Alcohol compound 1 | HEMA 20.82 g (160 mmol) | HEMA 26.03 g (200 mmol) | HEMA 19.52 g (150 mmol) | HEMA 26.03 g (200 mmol) | HEMA 26.03 g (200 mmol) |
| Tetracarboxylic dianhydride 2 | ODPA 6.21 g (20 mmol) | — | ODPA 7.76 g (25 mmol) | — | — |
| Alcohol compound 2 | HEMA 5.21 g (40 mmol) | — | HEMA 6.51 g (50 mmol) | — | — |
| Diamine 1 | TFDB 32.02 g (100 mmol) | DMAP 21.23 g (100 mmol) | TFDB 24.01 g (25 mmol) | DMAP 21.23 g (100 mmol) | TFDB 16.01 g (50 mmol) |
| Diamine 2 | — | — | DMAP 5.31 g (75 mmol) | — | DMAP 10.61 g (50 mmol) |
| Ratio of structural unit represented by general formula (1) based on total structural units | 80 | 0 | 25 | 0 | 0 |
| Synthesis method | 1 | 1 | 1 | 1 | 1 |
| Weight average molecular weight | 33000 | 37200 | 35000 | 60000 | 25000 |
| i-line transmittance | Good | Bad | Bad | Good | Bad |
| Residual stress | Good | Good | Good | Bad | Good |
| Water absorption | Good | Fair | Bad | Bad | Fair |

The details of each component shown in Table 2 are shown below.
HEMA: 2-hydroxyethyl methacrylate
IPA: 2-propanol As shown in Table 2, the polyamic acid esters of Examples 7 to 12 had an i-line transmittance of 20% or more and a stress of 30 MPa or less at a time. The polyamic acid ester of Comparative Example 6 in which a diamine that does not include a fluorine atom was used, and the polyamic acid esters of Comparative Examples 7 and 9 in which a diamine that includes a fluorine atom and a diamine that does not include a fluorine atom were used in combination of two or more, had a stress of 30 MPa or less, but had a low i-line transmittance. The polyamic acid ester of Comparative Example 8 in which a specific acid dianhydride corresponding to the polyimide precursor according to the invention was not used, had an i-line transmittance of 20% or more, but had a stress of 35 MPa or more.

Examples 13 to 17 and Comparative Examples 10 to 13

Preparation and Evaluation of Photosensitive Resin Composition 100 parts by weight of any one of polyamic acid esters among the polyamic acid esters respectively obtained in Examples 7 to 11 or Comparative Examples 6 to 9, 20 parts by weight of tetraethylene glycol dimethacrylate, and 2 parts by weight of 1,2-octanedione-1-[4-(phenylthio)phenyl-2-(O-benzoyloxime)] were homogenously dissolved in 150 parts by weight of N-methyl-2-pyrrolidone with stirring, and the solution was filtered through a filter having a pore size of 1 μm under pressure to obtain a photosensitive resin composition.

The photosensitivity, the residual stress, and the water absorption of the resulting photosensitive resin composition were evaluated. The results are shown in Table 3.

Note that the photosensitivity was evaluated using the method described later, and the residual stress and the water absorption were evaluated in the same manner as in Example 1.

Example 18

Preparation and Evaluation of Photosensitive Resin Composition 100 parts by weight of the polyamic acid ester obtained in Example 12, 20 parts by weight of tetraethylene glycol dimethacrylate, 2 parts by weight of 1,2-octanedione-1-[4-(phenylthio)phenyl-2-(O-benzoyloxime)], and 3 parts by weight of benzotriazole were homogenously dissolved in 150 parts by weight of N-methyl-2-pyrrolidone with stirring, and the solution was filtered through a filter having a pore size of 1 μm under pressure to obtain a photosensitive resin composition.

The resulting photosensitive resin composition were evaluated in the same manner as in Examples 13 to 17, and also evaluated as to a residue on a copper substrate. The results are shown in Table 3. Note that a residue on a copper substrate was evaluated using the method described later.

Example 19

Preparation and Evaluation of Photosensitive Resin Composition 100 parts by weight of the polyamic acid ester obtained in Example 12, 20 parts by weight of tetraethylene glycol dimethacrylate, 2 parts by weight of 1,2-octanedione-1-[4-(phenylthio)phenyl-2-(O-benzoyloxime)], and 3 parts by weight of tetrazole were homogenously dissolved in 150 parts by weight of N-methyl-2-pyrrolidone with stirring, and the solution was filtered through a filter having a pore size of 1 μm under pressure to obtain a photosensitive resin composition.

The resulting photosensitive resin composition was evaluated in the same manner as in Example 18. The results are shown in Table 3.

Example 20

Preparation and Evaluation of Photosensitive Resin Composition 100 parts by weight of the polyamic acid ester obtained in Example 12, 20 parts by weight of tetraethylene glycol dimethacrylate, 2 parts by weight of the compound represented by the above-mentioned formula (22-2), and 2 parts by weight of benzotriazole were homogenously dissolved in 150 parts by weight of N-methyl-2-pyrrolidone with stirring, and the solution was filtered through a filter having a pore size of 1 μm under pressure to obtain a photosensitive resin composition.

The resulting photosensitive resin composition was evaluated in the same manner as in Example 18. The results are shown in Table 3.

Example 21

Preparation and Evaluation of Photosensitive Resin Composition 100 parts by weight of the polyamic acid ester obtained in Example 12, 20 parts by weight of tetraethylene glycol dimethacrylate, and 2 parts by weight of the compound represented by the above-mentioned formula (25) were homogenously dissolved in 150 parts by weight of N-methyl-2-pyrrolidone with stirring, and the solution was filtered through a filter having a pore size of 1 μm under pressure to obtain a photosensitive resin composition.

The resulting photosensitive resin composition was evaluated in the same manner as in Examples 13 to 17. The results are shown in Table 3.

Evaluation of Photosensitivity and Residue on Copper Substrate (a) Photosensitivity The photosensitive resin composition obtained was spin-coated onto a 6-inch silicon wafer, and dried at 100° C. for 3 minutes on a hot plate to form a film having a thickness of 10 μm. The film was exposed by applying an i-line (50 to 500 mJ/cm² (every 50 mJ/cm²)) to the film through a photomask in a given pattern using an i-line stepper (FPA-3000iW manufactured by Canon Inc.). The unexposed film having a thickness of 10 μm was immersed in cyclopentanone, and the time required for the film to be completely dissolved was measured. A time twice the time thus measured was taken as a developing time. The wafer subjected to exposure was immersed in cyclopentanone to effect paddle development, and rinsed with isopropanol. The minimum dose at which the dissolution amount of the exposed area of the film was less than 10% of the initial thickness was taken as the sensitivity, and the minimum value of the mask dimensions of the square-hole opening was taken as the resolution. The photosensitivity was evaluated in accordance with the following standard.

(a-1) Sensitivity

Good: The sensitivity was 300 mJ/cm² or less.
Fair: The sensitivity was more than 300 mJ/cm² and 500 mJ/cm² or less.
Bad: The sensitivity was more than 500 mJ/cm².

(a-2) Resolution

Good: The resolution was 10 μm or less.
Fair: The resolution was more than 10 μm and 30 μm or less.
Bad: The resolution was more than 30 μm.

(b) Evaluation of Residue on Copper Substrate

A copper substrate provided for measuring a residue on the copper substrate (on which a patterned cured film was formed in the same manner as described above (see "(a) Photosensitivity")) was heated at 375° C. and 300° C. for 1 hour in a nitrogen atmosphere using a vertical diffusion furnace (manufactured by Koyo Lindberg Co., Ltd.) to obtain a patterned polyimide film (cured film). The patterned polyimide film was ashed for 2 minutes using an $O_2$ ashing device (manufactured by Yamato Scientific Co., Ltd.), immersed in a Cu oxide film removal solution (Z-200 manufactured by World Metal Co., Ltd.) for 5 minutes, and rinsed with purified water. After removing water that adhered to the surface of the cured film, the cured film was air-dried. A residue in the opening of the pattern was observed using an SEM (manufactured by Hitachi High-Technologies Corporation), and a case where a polyimide residue was not observed in the opening was evaluated as "Good". In Table 3, "-" in evaluation of residue represents that a residue on a copper substrate was not evaluated.

TABLE 3

| item | Example 13 | Example 14 | Example 15 | Example 16 | Example 17 | Example 18 | Example 19 | Example 20 |
|---|---|---|---|---|---|---|---|---|
| Polyamic acid ester | Example 7 | Example 8 | Example 9 | Example 10 | Example 11 | Example 12 | Example 12 | Example 12 |
| Sensitivity | Good | Good | Good | Good | Good | Good | Good | Good |
| Resolution | Good | Good | Good | Good | Good | Good | Good | Good |
| Residual stress | Good | Good | Good | Good | Good | Good | Good | Good |
| Water absorption | Good | Good | Good | Good | Good | Good | Good | Good |
| Residue | — | — | — | — | — | Good | Good | Good |

| item | Example 21 | Comparative Example 10 | Comparative Example 11 | Comparative Example 12 | Comparative Example 13 |
|---|---|---|---|---|---|
| Polyamic acid ester | Example 12 | Comparative Example 6 | Comparative Example 7 | Comparative Example 8 | Comparative Example 9 |
| Sensitivity | Good | — | Good | Good | Good |
| Resolution | Good | — | Fair | Good | Fair |
| Residual stress | Good | Good | Good | Bad | Good |
| Water absorption | Good | Fair | Fair | Bad | Fair |
| Residue | — | — | — | — | — |

As shown in Table 3, the photosensitive resin compositions of Examples 13 to 21 exhibited excellent sensitivity and excellent resolution, and the cured films obtained using the photosensitive resin compositions of Examples 13 to 21 exhibited a low stress of 30 MPa or less. When using the resin composition of Comparative Example 10, delamination occurred during development, and the sensitivity and the resolution could not be evaluated. When using the resin compositions of Comparative Examples 11 and 13, the resolution decreased since the i-line transmittance of the polyamic acid ester was low. The resin composition of Comparative Example 12 exhibited excellent sensitivity and excellent resolution. However, the residual stress of the resulting cured film was higher than 35 MPa.

INDUSTRIAL APPLICABILITY

The resin composition that includes the polyimide precursor according to the invention may suitably be used as a protective film material and a patterned film-forming material used for electronic parts such as a semiconductor device.

Although only some exemplary embodiments or examples of this invention have been described in detail above, those skilled in the art will readily appreciate that many modifications are possible in the exemplary embodiments or examples without materially departing from the novel teachings and advantages of this invention. Accordingly, all such modifications are intended to be included within the scope of the invention.

The documents described in the specification, and the specification of the Japanese patent application to which the present application claims priority under the Paris Convention, are incorporated herein by reference in their entirety.

The invention claimed is:

1. A photosensitive resin composition comprising:
   (a) a polyimide precursor comprising
      (a1) a structural unit represented by a general formula (1) in a ratio of 50 mol % or more based on total structural units, and

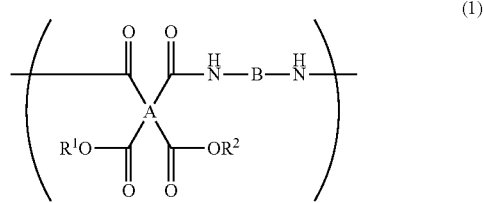

(a2) a structural unit represented by a general formula (4),

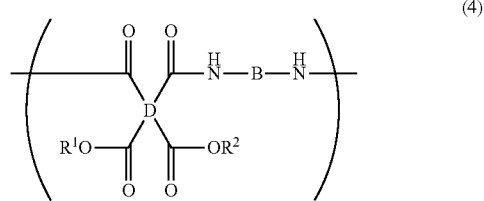

wherein A is a tetravalent organic group represented by a formula (2a), a tetravalent organic group represented by a formula (2b), or a tetravalent organic group represented by a general formula (2c), B is a divalent organic group represented by a general formula (3), and $R^1$ and $R^2$ are independently a hydrogen atom or a monovalent organic group,

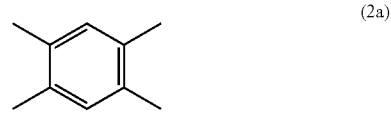

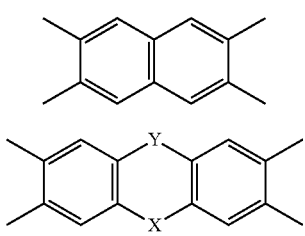
(2b)

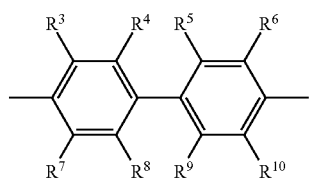
(2c)

wherein X and Y are independently a divalent group that is not conjugated with benzene rings bonded thereto, or a single bond,

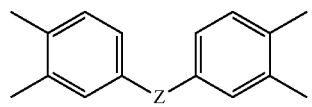
(3)

wherein $R^3$ to $R^{10}$ are independently a hydrogen atom or a monovalent group, at least one of $R^3$ to $R^{10}$ being a trifluoromethyl group, wherein D is a tetravalent organic group represented by a general formula (5), and B, $R^1$ and $R^2$ are the same as defined above in connection with the general formula (1), and (5)

wherein Z is an ether bond (—O—) or a sulfide bond (—S—);

(b) a compound that generates radicals when irradiated with active rays;

(c) a solvent; and (d) a tetrazole, a tetrazole derivative, benzotriazole, or a benzotriazole derivative.

2. The photosensitive resin composition according to claim 1, wherein the molar ratio of the structural unit represented by the general formula (1) and the structural unit represented by the general formula (4) is 5/5 to 9/1.

3. The photosensitive resin composition according to claim 1, wherein $R^1$ or $R^2$ in the general formula (1) is a monovalent organic group that comprises a carbon-carbon unsaturated double bond.

4. The photosensitive resin composition according to claim 1, wherein the component (b) comprises an oxime ester compound.

5. The photosensitive resin composition according to claim 4, wherein the oxime ester compound is a compound represented by a general formula (22), a compound represented by a general formula (23), or a compound represented by a general formula (24),

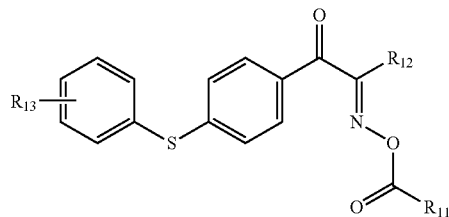
(22)

wherein $R_{11}$ and $R_{12}$ are independently an alkyl group having 1 to 12 carbon atoms, a cycloalkyl group having 4 to 10 carbon atoms, or a phenyl group, and $R_{13}$ is —H, —OH, —COOH, —O(CH$_2$)OH, —O(CH$_2$)$_2$OH, —COO(CH$_2$)OH, or —COO(CH$_2$)$_2$OH,

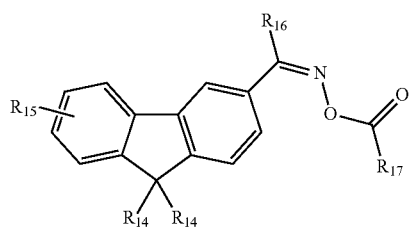
(23)

wherein $R_{14}$ are independently an alkyl group having 1 to 6 carbon atoms, $R_{15}$ is NO$_2$ or ArCO (wherein Ar is an aryl group), and $R_{16}$ and $R_{17}$ are independently an alkyl group having 1 to 12 carbon atoms, a phenyl group, or a tolyl group,

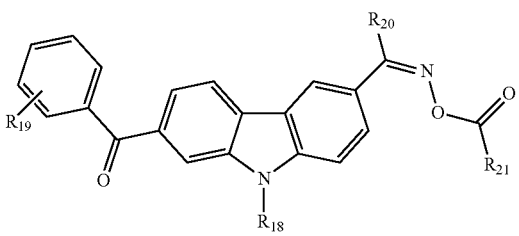
(24)

wherein $R_{18}$ is an alkyl group having 1 to 6 carbon atoms, $R_{19}$ is an organic group that comprises an acetal bond, and $R_{20}$ and $R_{21}$ are independently an alkyl group having 1 to 12 carbon atoms, a phenyl group, or a tolyl group.

6. A cured film obtained by heating the photosensitive resin composition according to claim 1.

7. A patterned cured film obtained by heating the photosensitive resin composition according to claim 1.

8. A method for producing a patterned cured film, the method comprising the steps of:
applying the photosensitive resin composition according to claim 1 to a substrate, and drying the applied photosensitive resin composition to form a film;
exposing the film in a pattern by applying active rays to the film;
removing an unexposed area of the film by development to obtain a patterned resin film; and
heating the patterned resin film.

9. A semiconductor device comprising a patterned cured film obtained using the method for producing a patterned cured film according to claim 8.

10. The photosensitive resin composition according to claim 1, wherein the polyimide precursor additionally comprises an addition-polymerizable compound.

11. The photosensitive resin composition according to claim 1, wherein the polyimide precursor additionally comprises a tetrazole or a tetrazole derivative selected from the group consisting of 1H-tetrazole, 5-methyl-1H-tetrazole, 5-phenyl-1H-tetrazole, 5-amino-1H-tetrazole, 1-methyl-1H-tetrazole, 5,5'-bis-1H-tetrazole, 1-methyl-5-ethyltetrazole, 1-methyl-5-mercaptotetrazole, and 1-carboxymethyl-5-mercaptotetrazole.

12. The photosensitive resin composition according to claim 1, wherein the polyimide precursor additionally comprises a benzotriazole or a benzotriazole derivative selected from the group consisting of benzotriazole, 1H-benzotriazole-1-acetonitrile, benzotriazole-5-carboxylic acid, 1H-benzotriazole-1-methanol, carboxybenzotriazole, and mercaptobenzoxazole.

13. The photosensitive resin composition according to claim 1, wherein the tetravalent organic group that produces the structure represented in formula (1) by A is one or more selected from the group consisting of pyromellitic dianhydride, 2,3,6,7-naphthalenetetracarboxylic dianhydride, and the tetracarboxylic dianhydrides respectively represented by the following formulas (6) to (12),

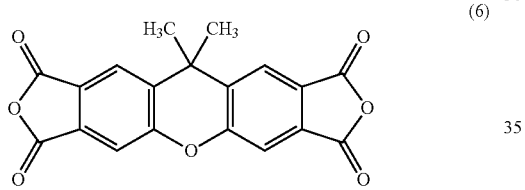

(6)

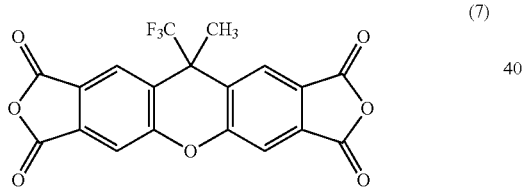

(7)

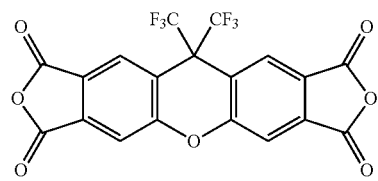

(8)

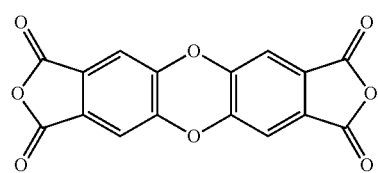

(9)

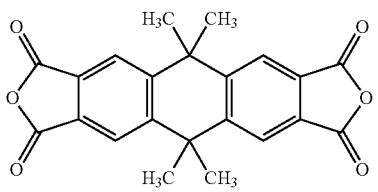

(10)

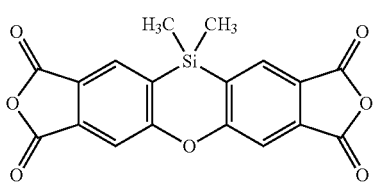

(11)

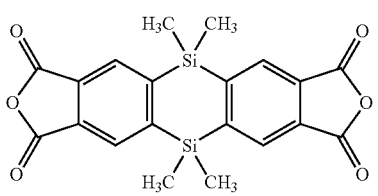

(12)

* * * * *